United States Patent [19]

Azoulay et al.

[11] Patent Number: 5,212,113
[45] Date of Patent: May 18, 1993

[54] PROCESS FOR THE SELECTIVE EPITAXY AND ETCHING OF A III-V MATERIAL IN THE SAME OMCVD GROWTH FRAME

[75] Inventors: Rosette Azoulay, Fontenay aux Rose; Louis Dugrand, Chelles, both of France

[73] Assignee: France Telecom Etablissement Autonome de Droit Public (Centre National d'Etudes des Telecommunications), Issy les Moulineaux, France

[21] Appl. No.: 760,157

[22] Filed: Sep. 16, 1991

[30] Foreign Application Priority Data

Sep. 20, 1990 [FR] France .................. 90 11615

[51] Int. Cl.$^5$ ............... H01L 21/203; H01L 21/20
[52] U.S. Cl. .................... 437/107; 437/126; 437/133
[58] Field of Search ............. 437/106, 107, 108, 126, 437/133

[56] References Cited

U.S. PATENT DOCUMENTS

| | | | |
|---|---|---|---|
| 4,368,098 | 1/1983 | Manasevit | 156/606 |
| 4,488,914 | 12/1984 | Quinlan et al. | 437/133 |
| 4,975,252 | 12/1990 | Nishizawa et al. | 118/724 |
| 5,103,271 | 4/1992 | Izumiya et al. | 357/17 |

FOREIGN PATENT DOCUMENTS 0305144  3/1989  European Pat. Off. .

OTHER PUBLICATIONS

Journal of Crystal Growth, vol. 99, Nos. 1/4, Jan. 1990, pp. 324–328, Amsterdam, NL; T. F. Kuech et al.: "Selective epitaxy of MOVPE GaAs using diethyl gallium chloride".

Patent Abstracts of Japan, vol. 13, No. 453 (E-831), 11 Oct. 1989.

Journal of the Electrochemical Society, vol. 113, No. 9, Sep. 1966, pp. 904–908; D. W. Shaw: "Selective epitaxial deposition of gallium arsenside in holes".

Primary Examiner—Olik Chaudhuri
Assistant Examiner—Ramamohan Paladugu
Attorney, Agent, or Firm—Oblon, Spivak, McClelland, Maier & Neustadt

[57] ABSTRACT

This process consists of depositing on a III-V or II-VI material (2) a mask layer (6), etching the latter in order to form therein openings (9) facing areas of the material on which epitaxy is to be carried out and then carrying out the epitaxy of the semiconductor layer (14) on said areas in an OMCVD frame by subjecting, at atmospheric pressure, the masked material simultaneously to vapours of chemical species of at least one III or II element and at least one V or VI element, as well as to vapours of HCl or at least one halide of a V or VI element, the elements III and V or II and VI of the chemical species and the halide being those which will form the semiconductor layer, said species being organometallic and/or hydrogen compounds. It is also possible, just prior to the epitaxy stage, to etch (12) the unmasked areas of the material, at atmospheric pressure, in the same frame as for the epitaxy using vapours of at least one halide of a III, V, II or VI element constituting the material to be etched.

8 Claims, 2 Drawing Sheets

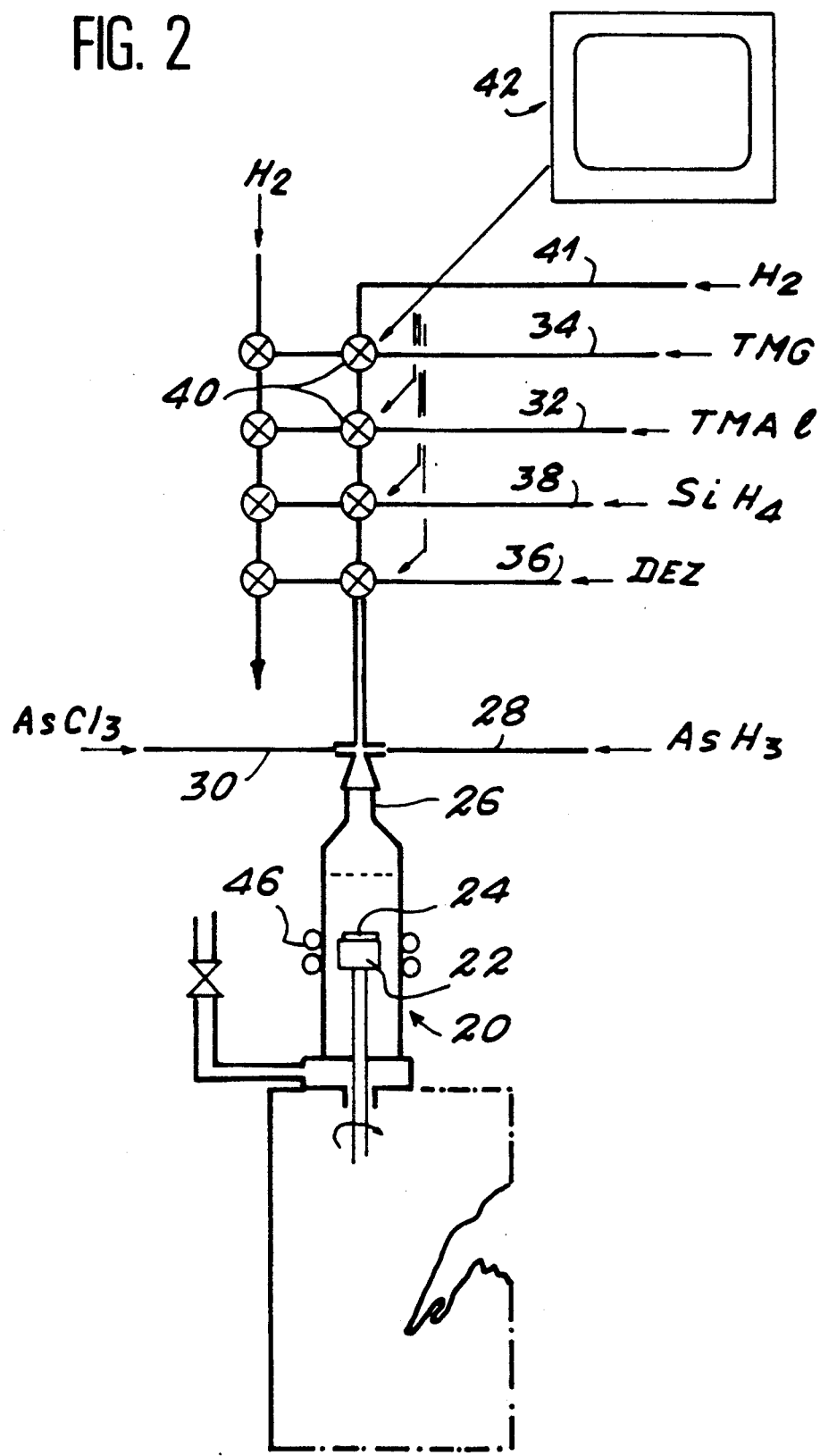

PROCESS FOR THE SELECTIVE EPITAXY AND ETCHING OF A III-V MATERIAL IN THE SAME OMCVD GROWTH FRAME

DESCRIPTION

The invention relates to a process for the selective epitaxy and optionally etching of a III-V or II-VI material in an OMCVD growth frame, more particularly making it possible to produce epitaxied, multilayer semiconductor structures more particularly usable in microelectronics and optoelectronics. Thus, these structures are used in the production of integrated circuits, buried laser sources, integrated laser-waveguide components, photoconductors, etc. The invention more particularly applies to the field of telecommunications.

It is pointed out that a III-V material contains one or more elements of column III and one or more elements of column V of the periodic classification of elements and a II-VI material is a material containing at least one II element and at least one VI element of said classification.

The integration of several III-V or II-VI components on the same support plate is an objective of manufacturers, both in the microelectronics and optoelectronics fields. For this purpose, it is necessary to control the procedures of etching and selective epitaxiing of the said materials.

Selective epitaxy is the method making it possible to produce a local monocrystalline deposit on a monocrystalline substrate partly masked by a dilectric layer or a metallic layer. Epitaxy is said to be totally selective when the growth only takes place in the openings of the mask and no deposit is observed on the mask, no matter what the relative dimensions of the masked and unmasked parts. Moreover, if the final structure is planar, i.e. all the components are at a same level, the subsequent technological stages will be made much easier. Therefore it must be possible to etch a plate in accordance with a desired shape and to selectively deposit the components in the cavities or grooves defined in this way.

It is therefore a question of performing the following stages:
1. deposition of the mask,
2. etching the mask,
3. etching the substrate through the openings in the mask,
4. selective epitaxy of the component in the openings of the mask.

At present, stages 3 and 4 are performed in different frames, which can pollute the surface of the substrate during the transfer of the sample from the etching chamber to the epitaxy chamber. This is in particular due to the different types of etching and epitaxy which are generally used.

Thus, at present, epitaxy of III-V materials takes place either by molecular beam epitaxy or MBE, operating under ultra-high vacuum conditions, or by vapour phase growth using organometallic compounds, designated OMCVD, operating under atmospheric or low pressure. Moreover, the etching of these materials presently takes place either by the wet route, i.e. by chemical etching using mixtures of acids in solution at atmospheric pressure, or by the dry route such as reactive ionic etching (RIE) at low pressure. In particular, FR-A-2 615 655 filed in the name of L. Henry and C. Vaudry teaches RIE etching with a gaseous mixture of $CH_4/Ar/H_2$ at pressures of 1 to 4 Pa. Moreover, the presently known epitaxy and etching methods all suffer from certain disadvantages.

In general, OMCVD epitaxy of GaAs takes place at atmospheric pressure starting with trimethyl gallium (TMG) and $AsH_3$ or arsine as the respective gallium and arsenic sources. For GaAlAs epitaxy, use is also made of trimethyl aluminium (TMAl) as the aluminium source. When epitaxy takes place on a substrate covered with a dielectric as the mask, the growth of GaAs or GaAlAs is monocrystalline in the openings of the mask and generally polycrystalline on the dielectric. Thus, this type of growth is not completely selective.

In order to obtain a totally selective epitaxy of GaAs, i.e. without any deposit on the dielectric, two OMCVD epitaxy approaches have been studied, one varying the physical growth conditions (reactor pressure, substrate temperature) and the other varying the chemical growth conditions (production of new molecules).

These known totally selective OMCVD epitaxy methods unfortunately introduce specific constraints such as the need to epitaxy at low pressure, which introduces a supplementary constraint for the process which can be prejudicial (more difficult performance conditions, increase in the production costs), or the need to synthesize special molecules for each material to be epitaxied.

In particular, the low pressure totally selective epitaxy of GaAs (10 Torr, i.e. $1.3.10^3$ Pa) on a GaAs substrate partly masked by $SiN_x$ has been described in the article by K. Kamon et al in Journal of Crystal Growth, 73, 1985, pp. 73–76 "Selective epitaxial growth of GaAs by low-pressure MOVPE". This epitaxy is carried out starting with TMG and arsine as the respective gallium and arsenic sources.

In the article by T. F. Kuech et al, Appl. Phys. Lett., 54, No. 10 of 6.3.1989, pp. 910–912 "Selective epitaxy in the conventional metalorganic vapour phase epitaxy of GaAs" a totally selective GaAs epitaxy is described using as the gallium precursor diethyl gallium chloride (DEGaCl) at low pressure (90 Torr, i.e. $1.2.10^4$ Pa). Apart from the constraints linked with the use of low pressures, i.e. below atmospheric pressure, this process requires the production of particular molecules which are not commercially available and which therefore complicate the process and make it more expensive.

The known RIE etching and MBE growth suffer from the disadvantage of using low pressures (leading to performance constraints) and wet etching suffers from the disadvantage of being isotropic, which does not make it possible to obtain etched patterns of micronic or submicronic size.

Therefore the invention proposes a totally selective epitaxy and optionally etching process in an OMCVD growth frame making it possible to obviate the aforementioned disadvantages. In particular, this process uses conventional physical growth conditions and chemical species generally used for said growth and which are commercially available. This process also makes it possible to etch III-V or II-VI substrates in the same growth frame.

More specifically, the invention relates to a process for the selective epitaxy of a semiconductor layer constituted by at least one III element and at least one V element or at least one II element and at least one VI element, incorporating the following stages:

a) depositing on a respectively III-V or II-VI monocrystalline material an epitaxy-resistant masking layer,
b) etching the masking layer in order to form therein openings facing the areas of the material on which selective epitaxy is to be carried out and
c) epitaxiing the semiconductor layer on said areas in an OMCVD frame, characterized in that state c) consists of subjecting, under atmospheric pressure, the masked material simultaneously to vapours of chemical species of at least one III or II element and at least one V or VI element, as well as to vapours of hydrochloric acid or at least one halide of a V or VI element, the III and V or II and VI elements of the chemical species and the halide being those intended to form the semiconductor layer, the said chemical species being organometallic and/or hydrogen compounds.

The term monocrystalline material is understood to mean a solid monocrystalline substrate, a monocrystalline semiconductor layer epitaxied on a substrate or a stack of monocrystalline semiconductor layers.

The process according to the invention is applicable to any semiconductor layer and binary, ternary or quaternary III-V material. In particular, the III element is chosen from among gallium, indium, aluminium and mixtures thereof and the V element from among phosphorus, arsenic, antimony and mixtures thereof.

The invention applies particularly well to the selective epitaxy of GaAs, $Ga_{1-x}Al_xAs$ with $0<x\leq 1$, but also to the epitaxy of InP, GaInAs and GaInAsP for all indium and/or phosphorus compositions.

Moreover, the process applies to any semiconductor material and binary, ternary or quaternary II-VI material. In particular, the II element is chosen from among zinc, cadmium, mercury and mixtures thereof and the VI element from among sulphur, selenium, tellurium and mixtures thereof.

The III-V semiconductor layers are grown either by thermal decomposition of polyalkyl of element III and polyalkyl of element V, or by thermal decomposition of polyalkyl of element III and hydrogen compounds of element V.

The growth of II-VI layers takes place either by thermal decomposition of polyalkyl of element II and polyalkyl of element VI, or by thermal decomposition of polyalkyl of element II and hydrogen compounds of element VI. The alkyl radicals used have 1 to 3 carbon atoms.

In particular, the deposition of semiconductor layers containing gallium, indium or aluminium respectively takes place by decomposition of trimethyl gallium (TMG) or triethyl gallium (TEG); triethyl indium (TEI) or trimethyl indium (TMI) and trimethyl aluminium (TMAl).

The deposition of semiconductor layers containing phosphorus, arsenic or antimony takes place by decomposition respectively of phosphene ($PH_3$), trimethyl phosphene (TMT) or triethyl phosphene (TEP); arsine ($AsH_3$) or trimethyl arsine (TMAs) and antimony hydride ($SbH_3$) or trimethyl antimony (TMS).

The deposition of layers containing zinc, cadmium or mercury takes place by decomposition respectively of diethyl tin (DEZ), trimethyl zinc (TMZ) or dimethyl zinc (DMZ); dimethyl cadmium (DMC) and dimethyl mercury (DMHg). For the deposition of layers containing sulphur, selenium or tellurium, use is respectively made of vapors of hydrogen sulphide ($H_2S$); hydrogen selenide ($H_2Se$) or dimethyl selenium (DMSe) and trimethyl tellurium (DMTe) or diethyl tellurium (DETe).

The epitaxy of a p-doped III-V semiconductor layer is obtained by subjecting the material onto which selective epitaxy is to be performed to the action of an organometallic compound of a II element of the periodic classification of elements. This organometallic compound is generally one of the aforementioned metallic polyalkyls.

In order to obtain a n-doped III-V epitaxied layer, the material is also exposed to an organometallic compound or to a hydrogen compound of an element of column VI of the periodic classification of elements, as referred to hereinbefore. It is also possible to use an organometallic compound or a hydrogen compound of column IV. To this end, it is possible to use silane ($SiH_4$) or trimethyl tin (TMS).

In order to obtain a n-doped II-IV epitaxied layer, the material is exposed to vapours of an organometallic compound of an element of column III such as TMG.

All these polyalkyls and hydrogen compounds are conventionally used for OMCVD growth of III-V or II-VI layers, which may or may not be doped and are commercially available.

Generally, the epitaxy of III-V and II-VI layers takes place on a substrate of the same nature as the layers, i.e. respectively in III-V or II-VI material. However, it is possible to use a substrate of a different nature, case of the selective epitaxy of ZnSe on a GaAs substrate.

The halide of element V or VI used for the selective epitaxy can be a chloride, bromide or fluoride and preference is given to a chloride.

In the particular case of a selective epitaxy of GaAs or $Ga_{1-x}Al_xAs$ with $0<x\leq 1$, arsenic trichloride ($AsCl_3$) is used as the selectivity halide. This product has the advantage of being commercially available in pure form.

For GaInAsP epitaxy, it is possible to use $AsCl_3$ or $PCl_3$ as the selectivity halide. For a HgCdTe epitaxy, use is made of HCl. For ZnSe epitaxy use is made of $SeCl_4$ as the selectivity halide, whilst for $ZnS_{1-y}Se_y$ with $0<y<1$ epitaxy, use is made either of $SeCl_4$ or $SCl_4$ as the selectivity halide.

The process according to the invention also permits, between stages b) and c), an etching of the unmasked areas of the III-V or II-VI material on which the selective epitaxy is to be carried out and using the same OMCVD growth frame as for epitaxy. Thus, by eliminating the transfer of the III-V or II-VI material from the etching frame to the selective epitaxy frame, there is a reduction of the risks of pollution of the surface of the material on which epitaxy is to take place. In addition, said etching is anisotropic.

Like the selective epitaxy, the etching of the unmasked areas of the III-V or II-VI materials on which the epitaxy is to be carried out is performed at atmospheric pressure using vapour of at least one halide of the III, V, II or VI element constituting the material to be etched.

For GaAs etching, use is advantageously made of a halide of element V and in particular arsenic trichloride. For a GaInAsP etching, it is possible to use $PCl_3$ or $AsCl_3$. HCl can be used for HgCdTe etching and for ZnSe etching use is made either of $SeCl_4$ or $SCl_4$ as a function of the composition of the material to be etched.

The process according to the invention can be performed with any existing OMCVD growth frame, provided that it is added a line for introducing the halide of the III, V, II or VI element for the epitaxy and/or the etching of the III-V or II-IV material.

The growth temperatures used are those conventionally employed. For GaAs epitaxy, the generally used growth temperatures are between 650° and 750° C. This range is preferably used for the growth. However, it is possible to work outside this temperature range without harming the selectivity of the deposit.

The selectivity epitaxy and etching of the III-V material take place at high temperature, i.e. exceeding 600° C., so that the material used for forming the epitaxy and/or etching mask must be stable at this temperature, which in particular excludes the use of the photosensitive resins generally used in microelectronics. The etching mask is in particular a dielectric or a metal and is e.g. silicon nitride, silicon dioxide, or tungsten deposited in polycrystalline form.

According to the invention, it is possible to obtain a selective epitaxy for all the values of the ratio R polyalkyl of element III (or II)/halide of element V (or VI) such that $0 < R \leq 6$ and preferably $1.5 \leq R \leq 6$. However, the optimum value for this ratio corresponds to the highest value thereof, i.e. that giving the lowest value of the halide of element III or II in the growth frame. Thus, it is under these conditions that the most attractive surface state of the epitaxied layer is obtained. In the particular case of GaAs and $Ga_{1-x}Al_xAs$ epitaxy, the $AsH_3/TMG$ optimum ratio is 20.

The process of the invention can apply to a material having any crystal orientation. However, generally use is made of the <001> face, because this has two cleaving planes <110> and <110> generally used in optoelectronics. It should be noted that this orientation of the material has no influence on the selectivity of the growth.

Other features and advantages of the invention can be gathered from the following illustrative and non-illustrative description with reference to the attached drawings, wherein:

FIG. 2 show diagrammatically an epitaxy frame for performing the process of the invention.

The following description relates to the selective epitaxy of GaAs or GaAlAs on a GaAs substrate. However, as has been stated hereinbefore, the invention has much more general applications.

Figure 1:
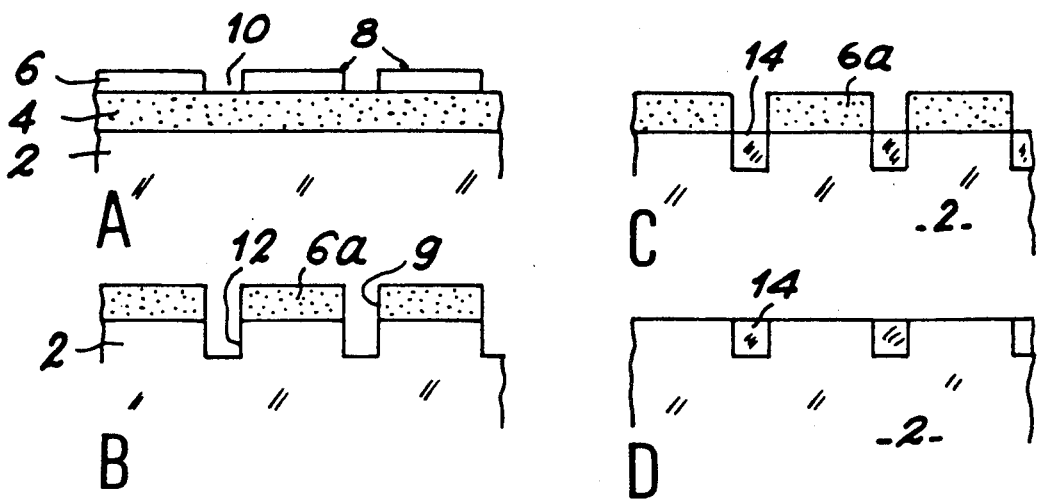
FIGS. 1A through 1D show diagrammatically the different stages of the process according to the invention.

FIG. 1 diagrammatically illustrates in cross-sectional form, the different stages of the process according to the invention. As shown in part A, the starting product is a monocrystalline GaAs substrate 2, whose surface 4 on which the selective epitaxy is to take place is parallel to the <001> plane. On said substrate 2 is deposited a silicon nitride ($Si_3N_4$) layer 6, in which will be produced the selective epitaxy and etching mask.

On the surface of the layer 6 is then formed a photolithographic mask 8 made from photosensitive resin and using known processes. This mask 8 has openings 10 facing the areas of the substrate 2 on which selective epitaxy is to take place. This is followed by the etching of the masking layer 6 in order to eliminate therefrom the areas not masked by the resin 8. This etching is a chemical etching using a hydrofluoric acid solution. Following the elimination of the resin mask 8 in known manner using a chemical process, the structure shown in part B of FIG. 1 is obtained. The patterns 6a of the masking layer obtained, as well as the openings 9 are constituted by strips parallel to direction <110> and <110> of the substrate 2.

This is followed by an etching of the regions of the substrate 2 not covered with silicon nitride. This etching is carried out with $AsCl_3$ in a known OMCVD frame, to which has been added a $AsCl_3$ supply, in the manner shown in FIG. 2. This etching is carried out at atmospheric pressure. The holes formed in the substrate carry the reference 12 in FIG. 1(A).

Using the same OMCVD frame, this is followed by a selective GaAs epitaxy. The structure obtained is shown in part C of FIG. 1.

The GaAs epitaxied in the holes 12 of the substrate 2 carries the reference 14.

This selective epitaxy is carried out by heating the substrate 2 to 650° to 750° C. and using a mixture of TMG, $AsH_3$ and $AsCl_3$ diluted in the vector gas constituted in general by hydrogen. Epitaxy is carried out at atmospheric pressure.

Under these conditions, a totally selective epitaxy is obtained and no crystallite appears on the silicon nitride patterns 6a, although the dielectric surface is larger than the GaAs surface exposed to the growth gases. Moreover, the crystal planes developing during epitaxial growth follow the direction of the patterns 6a, i.e. direction <110> or <110>.

The inventors have studied the influence of the $TMG/AsCl_3$ ratio on the growth rate and have found that it increased with this ratio. To explain these results, they propose the following reaction mechanism:

$AsCl_3$ decomposes in accordance with the following reaction (1):

$$AsCl_3 + 3/2 H_2 = \tfrac{1}{4} As_4 + 3 HCl \qquad (1)$$

The hydrochloric gas (HCl) formed is then adsorbed on the dielectric and blocks the growth. Two reactions are in competition in the openings 12, the etching governed by the following equation (2):

$$GaAs + HCl = GaCl + \tfrac{1}{4} As + \tfrac{1}{2} H_2 \qquad (2)$$

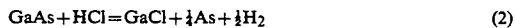

and the growth governed by the equation (3):

$$Ga(CH_3)_3 + AsH_3 = GaAs + 3 CH_4 \qquad (3)$$

By varying the $TMG/AdCl_3$ ratio, it is possible to favour one or other of these reactions and consequently it is possible to vary the deposition rate.

The optimum value of the $TMG/AsCl_3$ ratio is that corresponding to the lowest value of $AsCl_3$, because under these conditions the most attractive surface state of the epitaxied strips 14 is obtained and of the patterns 6a of the mask. This optimum value is 20. Following the elimination of the patterns 6a of the mask by chemical etching, the structure in part D of FIG. 1 is obtained.

By acting on the duration of the epitaxy and on the gas flow rate, it is possible to form epitaxied areas 14, whose surface is level with that of the substrate 2. This gives the perfectly planar structure shown.

In the same way, the Inventors carried out a selective epitaxy of $Ga_{1-x}Al_xAs$ with $x=0.2$ using TMAl as the supplementary epitaxy gas. The operating conditions were identical, as were the results obtained.

FIG. 2 diagrammatically shows an OMCVD frame for the etching of a III-V substrate and for the selective epitaxy of a III-V semiconductor layer thereon.

This apparatus with a vertical configuration has a silica glass reactor 20, in which is placed a susceptor 22 supporting the masked III-V monocrystalline material substrate 24 to be treated.

The gases necessary for etching the substrate and for the selective epitaxial growth are introduced at one of the ends 26 of the reactor 20, the other end being used for evacuating the reaction gases ($CH_4$, GaCl, etc.) and the gases which have not reacted.

FIG. 2 shows a pipe 28 for introducing arsine into the reactor 20, a pipe 30 for introducing $AsCl_3$, a pipe 32 for introducing TMAl and a pipe 34 for introducing TMG.

In order to carry out a n or p-type doping of the epitaxied areas, said apparatus also comprises a DEZ introduction pipe 36 and a $SiH_4$ supply pipe 38.

These different pipes are equipped with electrovalves 40 controlled in known manner by an electronic control circuit 42 of the microcomputer type. There is also a pipe 41 for introducing a vector gas consisting of hydrogen.

The OMCVD frame is controlled in known manner. The silica glass reactor 20 is placed in a halogen lamp furnace for heating the substrate during etching and epitaxy, said lamps carrying the reference 46.

Figure 3:
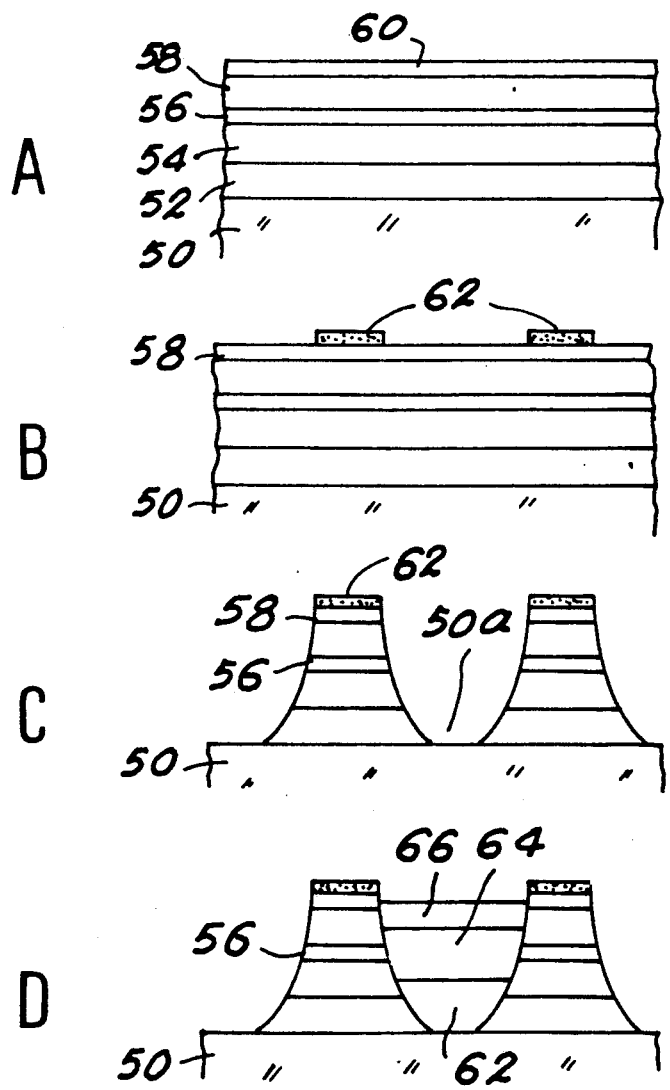
FIGS. 3A through 3D show diagrammatically the inventive production of an integrated laser-waveguide structure.

With the process according to the invention, it is possible to bring about the integration of a laser and a waveguide on the same substrate, as is diagrammtically shown in FIG. 3.

On a monocrystalline GaAs substrate 50 of orientation <100>, are successively performed in an OMCVD frame the epitaxy of the different layers of the laser using organometallic compounds and/or hydrogen compounds described hereinbefore, e.g. the epitaxy of a n-doped GaAs buffer layer 52, the epitaxy of the lower n-doped $Ga_{1-x}Al_xAs$ confinement layer with x=0.30, then the epitaxy of the not intentionally doped GaAs active layer 56, the epitaxy of the upper p-doped $Ga_{1-x}Al_xAs$ confinement layer 58 with x=0.30 and finally the p+-doped GaAs contact layer 60.

A silicon nitride mask 62 is then produced in the manner described in FIG. 1, fixing the lateral dimensions of the laser and those of the waveguide to be produced.

Then, using the apparatus of FIG. 2, the epitaxied layers 60-52 are etched until the regions of the substrate 58 on which the selective epitaxy of the different waveguide layers is to take place are exposed. This etching is carried out with $AsCl_3$ at atmospheric pressure and in this way the laser is formed.

Then, using the same frame, there is a selective epitaxy of a $Ga_{1-x}Al_xAs$ layer 62 with x=0.30 constituting the lower confinement layer of the waveguide, followed by the epitaxy of a GaAs layer 64 constituting the guide layer and then the epitaxy of a $Ga_{1-x}Al_xAs$ layer 66 with x=0.30 constituting the upper confinement layer of the guide. The thicknesses of the layers 62, 64 and 66 are such that the guide layer 64 is located in the extension of the active layer 56 of the laser. After eliminating the nitride mask 62, a planar structure is obtained.

The deposition and etching conditions are the same as those described relative to FIG. 1.

Instead of growing the layers 62 to 66, it is possible to grow a thick p−-doped $Ga_{1-x}Al_xAs$ thick layer with x=0.35 to 0.40. This gives a single buried laser structure with lateral confinement.

The process according to the invention makes it possible to obtain a laser-waveguide or laser only structures with a planar surface, contrary to the conventional processes for producing them. Instead of producing these integrated structures on a GaAs substrate, they can be produced on an InP substrate. For this purpose it is merely necessary to replace the GaAs layers by InP layers and the GaAlAs layers by GaAsInP layers.

We claim:

1. Process for the selective epitaxy of a semiconductor layer constituted by at least one III element and at least one V element, incorporating the following stages:
   a) depositing on a III-V monocrystalline material (2) an epitaxy-resistant masking layer (6),
   b) etching the masking layer in order to form therein openings (9) facing the areas of the material on which selective epitaxy is to be carried out and
   c) epitaxiing the semiconductor layer (14) on said areas in an OMCVD frame, characterized in that stage c) consists of subjecting, under atmospheric pressure, the masked material simultaneously to vapours of chemical species of at least one III element and at least one V element, as well as to vapours of hydrochloric acid or at least one halide of a V element, the III and V elements of the chemical species and the halide being those intended to form the semiconductor layer, the said chemical species being organometallic and/or hydrogen compounds.

2. Process according to claim 1, characterized in that the III element is chosen from among gallium, indium, aluminum and mixtures thereof and in that the V element is chosen from among phosphorus, arsenic, antimony and mixtures thereof.

3. Process according to claim 1, characterized in that the halide of the V element is a chloride.

4. Process according to claim 1 applied to the epitaxy of GaAs or $Ga_{1-x}Al_xAs$ with $0 < x < 1$, characterized in that arsenic trichloride that arsenic trichloride is used as the halide.

5. Process according to claim 1 applied to the epitaxy of a n or p-doped III-V layer, characterized in that the material is also exposed to the vapours of an organometallic compound and/or a hydrogen compound of a respectively n or p-doping element.

6. Process according to claim 1, characterized in that it comprises, between stages b) and c), an etching (12) of the unmasked areas of the material, said etching also being carried out at atmospheric pressure in the OMCVD frame used for selective epitaxy, said etching being carried out with the aid of vapours of at least one halide of the III or V element constituting the material to be etched.

7. Process according to claim 6 applied to the etching of GaAs, characterized in that arsenic trichloride is used for said etching.

8. Process according to claim 4, characterized in that it comprises, between stages b) and c), an etching (12) of the unmasked areas of the material, said etching also being carried out at atmospheric pressure in the OMCVD frame used for the selective epitaxy, said etching being carried out with the aid of vapours of at least one arsenic halide constituting the material to be etched.

* * * * *